United States Patent
Manabe et al.

(10) Patent No.: US 6,419,811 B2
(45) Date of Patent: Jul. 16, 2002

(54) METHOD FOR SURFACE TREATMENT OF COPPER FOIL

(75) Inventors: Hisanori Manabe, Kurisuno; Masasto Takami, Gokasho; Masaru Hirose, Higashino Minami, all of (JP)

(73) Assignee: Fukuda Metal Foil & Powder Co., Ltd. (JP)

( * ) Notice: Subject to any disclaimer, the term of this patent is extended or adjusted under 35 U.S.C. 154(b) by 0 days.

(21) Appl. No.: 09/833,059

(22) Filed: Apr. 12, 2001

(30) Foreign Application Priority Data

Apr. 14, 2000 (JP) .......................... 2000-112808

(51) Int. Cl.$^7$ ..................... C23C 28/00; C25D 5/34
(52) U.S. Cl. ................ 205/194; 205/197; 205/215; 205/219
(58) Field of Search ................ 205/574, 215, 205/194, 197, 219

(56) References Cited

U.S. PATENT DOCUMENTS 5,366,814 A * 11/1994 Yamanishi et al. ......... 428/607
6,096,140 A * 8/2000 Susa et al. .................. 148/253

FOREIGN PATENT DOCUMENTS

| JP | 53-039327 | 11/1978 |
| JP | 06-169169 | 6/1994 |

* cited by examiner

*Primary Examiner*—Edna Wong
(74) *Attorney, Agent, or Firm*—Ronald E. Greigg

(57) ABSTRACT

Disclosed is a process of treating the surface of copper foil without using harmful elements such as arsenic, selenium and tellurium unlike in the prior art. It is possible to, in an easy way, obtain a uniform rough condition and low roughness and produce a high peel strength to such resin base materials as polyimide resin which is weak in peel strength. The process comprises a roughening treatment involving a cathodic electrolysis of at least one side of copper foil near or above the limiting current density in an electrolytic bath containing titanium ions and tungsten ions and prepared by adding sulfuric acid and copper sulfate so as to have copper protrusions deposited and then coating the depositions with copper or copper alloy in a cathodic electrolysis, followed by giving to the surface of the above-mentioned copper or the copper alloy at least one rust-proofing treatment.

2 Claims, No Drawings

METHOD FOR SURFACE TREATMENT OF COPPER FOIL

BACKGROUND OF THE INVENTION

1. Field of the Invention

The present invention relates to the surface treatment of copper foil. More specifically, this invention concerns the method of treating the surface of copper foil to create a surface with a rough and uniform condition and with a high adhesion to resins for use in the field of printed circuit boards.

2. Description of the Prior Art

Copper foil is used in printed circuit boards for electronics and electric materials in large quantities.

Printed circuit boards are made in the following process. First, the matte side of copper foil is put on an insulating resin-impregnated base material, heated and press-bonded into a copper clad laminate. The glass-epoxy resin base material (FR-4) which is widely used is pressed at 170° C. for one to two hours. Some base materials like glass and high heat-resistant resins such as polyimide require pressing for two hours at 220° C.

Printed circuit boards have been improved in performance and reliability, and the properties required in the printed circuit boards are getting complicated and diversified.

The copper foil, one of the constituent materials of the printed circuit board, too, has to meet vigorous quality requirements.

Copper foil for printed circuit boards is available in two kinds, that is, rolled copper foil and electrodeposited copper foil. The electrodeposited copper foil which has a matte side and a shiny side is used in predominantly large quantities.

The electrodeposited copper foil is generally made in the following process. Copper is deposited from a copper electrolytic solution in an electrodeposition apparatus to obtain a crude foil which is called untreated copper foil. Then, the matte side (non-shiny side) of the untreated copper foil is pickled for roughening treatment to secure adhesion to the resin. Then, the copper foil is treated to improve and stabilize such properties as heat resistance and chemical resistance and etching properties.

A number of techniques for those treatments have been developed and proposed, which make available copper foils with high-functional surfaces.

Printed circuit boards have been highly densified in recent years, and the insulating layer or the resin layer is made very thin in thin printed circuit boards and build-up process printed circuit boards, for example. Such printed circuit boards can present problems with inner-layer insulating properties if the roughened side of copper foil is high in degree of roughness.

In a recent trend toward fine lining, furthermore, a matte side with a low profile is being expected, because a lower degree of roughness on the roughened side of copper foil can keep the inter-line insulation better. However, if the adhesion is not sufficient, the copper foil circuit will present such problems as peeling, lifting, and delamination in the course of or after manufacturing. Those requirements are conflicting with each other, and a process of surface treatment that meet those conflicting requirements is expected.

Furthermore, as base material for printed circuit boards, glass-epoxy resin base material (FR-4) has been widely used, while base materials impregnated with special resins like polyimide resin, high heat-resistant and low dielectric constant resins are finding increasing use in printed circuit boards because of the high reliability.

Such special resins are low in adhesion for copper foil. It is hoped that a process of surface treatment should be developed that solves the adhesion problem on the low profiled surface.

Meanwhile, the shiny side or the reverse side of the matte side of copper foil requires properties different from those on the matte side. They include resistance to heat color change, solder wettability and resist adhesion. The matte side needs a process of surface treatment different from that for the shiny side.

In the past, no solder wettability is required in the shiny side of copper foil for use in multi-layer printed circuit boards, especially as inner layer and did not need to be roughened.

But even in an application called DT (double treatment) foil other than copper foil, light roughening has come to be hoped for to improve the adhesion for resist and the adhesive strength in treatment of inner layers in forming a printed circuit board.

Sophisticated treatments have been developed to meet a variety of requirements made on the matte side and the shiny side of copper foil.

A number of processes of roughening copper foil are disclosed. For example, Japanese publicized examined patent application gazette No. 53-38700 discloses a process involving a three-step electrolytic treatment in an acid electrolytic bath containing arsenic. Japanese publicized examined patent application gazettes Nos. 53-39327 and 54-38053 disclose processes comprising carrying out electrolysis at around the limiting current density in an acid copper electrolytic bath containing arsenic, antimony, bismuth, selenium, and tellurium. Japanese patent No. 2717911 discloses a process involving electrolysis at around the limiting current density in an acid copper electrolytic bath containing either chromium or tungsten or both.

But some of the above-mentioned processes use such substances as arsenic, selenium and tellurium that are harmful to humans and have to be extremely limited in their uses in the light of the environmental protection. It is feared that the harmful components contained in copper foil could pollute the environment when printed circuit boards are recycled or disposed of as industrial waste.

One of the disclosed processes of surface treatment involves treatment in a bath containing chromium and tungsten. In this process, the roughened surface condition improves in uniformity but is low in adhesive strength to glass epoxy resin base material (FR-4) and especially glass-polyimide resin base material etc. and is not practically useful.

SUMMARY OF THE INVENTION

In view of the prior art described above, including the 20 disadvantages and problems of the prior art, it is an object of the present invention to provide an easy process of copper foil surface treatment which does not use such harmful substances as arsenic, selenium and tellurium and which produces a copper foil with a uniform matte condition, a low surface roughness and a high adhesive strength for such base resins with a weak adhesion as polyimide resin.

The foregoing object is effected by the invention as will be apparent from the following description. That is, at least one side of copper foil is subjected to a roughening treatment involving a cathodic electrolysis near or above the limiting current density in an electrolytic bath containing titanium ions and tungsten ions and prepared by adding sulfuric acid and copper sulfate so as to have copper protrusions deposited and then the depositions are coated with copper or a copper alloy in a cathodic electrolysis. Then the surface of the above-mentioned copper or the copper alloy is given at least one of the following rust-proofing treatments—chromate treatment, organic rust-proofing treatment and silane coupling agent treatment.

It is preferable that the concentration of titanium ions is 0.03 to 5 10 g/l and the concentration of tungsten ions is 0.001 to 0.3 g/l in the electrolytic bath.

The roughening treatment method according to the present invention will be described. First, untreated copper foil is pickled to remove oxides and stains on the surface. Then, the matte surface of the copper foil is subjected to cathodic electrolysis near or above the limiting current density in an electrolytic bath so as to have copper protrusions deposited on the surface, thus forming an uneven surface.

The deposited copper protrusions are weak in adhesive strength to the surface of the copper foil. After that, therefore, a coat of copper or copper alloy is formed by cathodic electrolysis so as to coat the protrusions with the copper, thus keeping copper foil and copper protrusions from peeling off. Then, the coat of copper or copper alloy is subjected to rust proofing treatment.

The cathodic electrolysis conditions to deposit copper protrusions on the copper foil surface are different depending on the concentration of the electrolytic bath, time, temperature, the required extent of roughing, and not limited in particular. But the preferable conditions are treatment time 2 to 60 seconds, bath temperature 10 to 50° C., current density 5 to 100 A/dm$^2$, quantity of electricity 20 to 200 C/dm$^2$, more preferably 40 to 130 C/dm$^2$. Under those conditions, cathodic electrolysis can be carried out near or above the limiting current density.

It is preferable that the electrolytic bath contains 0.03 to 5 g/l of titanium ions and 0.001 to 0.3 g/l of tungsten. Sulfuric acid may be used in 50 to 200 g/l and copper sulfate in 5 to 200 g/l, but the addition is not limited to these ranges, because the bath temperature, current density etc. have effects on the electrolysis conditions.

As titanium ion source, it is preferable to use titanic sulfate solution. The addition of titanium ion is preferably 0.03 to 5 g/l, more preferably 0.2 to 0.8 g/l.

The reason why the concentration range is restricted as mentioned above is to make copper deposited protrusions uniform and fine. The addition of not larger than 0.03 g/l is not desirable because the copper deposited protrusions will not be uniform. The concentration of not smaller than 5 g/l is not desirable, because the copper deposited protrusion will be too fine and could leave copper on the printed circuit board side after etching.

As tungsten ion sources, it is possible to use tungstic acid and its salts such as its salt, sodium salt, potassium salt, ammonium salt etc. Tungsten ion is added in 0.001 to 0.3 g/l, preferably 0.005 to 0.08 g/l.

The reason why the concentration range is limited as mentioned above is to curb the growth of the projection of copper and to improve the adhesion for the surface of copper foil. If the concentration is not larger than 0.001 g/l, it will be less effective in making copper deposited protrusions uniform and it is possible that a uniform matte condition cannot be obtained. If, on the other hand, the concentration is not smaller than 0.3 g/l, it will be so effective in curbing the growth of copper protrusions that sufficient adhesive strength can not be obtained. To increase the adhesive strength, it will be necessary to increase the concentration of titanium ions. That is bad economy.

The reason why titanium ions and tungsten ions are used in combination is this. Titanium ions are effective in micronizing the copper deposited protrusion and making the roughness on the rough surface uniform but tends to leave copper on the printed circuit board surface after etching. That is why the use of titanium ions alone is not desirable. On the other hand, tungsten ions are effective in curbing the formation of dendrites and controlling the nucleation. But tungsten alone is not effective in imparting adhesive strength, especially to the glass polyimide resin base material. Without either titanium or tungsten, no desired results can be expected in a roughening treatment.

If titanium and tungsten ions are added, the rough condition is uniform with a low roughness. In addition, a high adhesive strength can be imparted to such base materials as glass-polyimide which is generally weak in adhesive strength.

As set forth above, the copper foil subjected to roughening treatment in an electrolytic solution with titanium and tungsten ions added thereto is generally uniform in rough surface condition with a low roughness on the surface. That is a rough surface just for a fine pattern.

On the other hand, in case neither titanium ions nor tungsten ions are added, the rough condition with copper protrusions is not very uniform with rough and large dendrites formed. And copper can remain on the etched surface of the printed circuit board after press molding. This defect is fatal to the printed circuit board. The wiring density is high nowadays, and even if no copper is found left, the wiring edge formed in a delicate etching time is poor in fineness. There is a possible of a short circuit being caused. That is, there arises a problem with insulation. Such a printed circuit board is problematical.

After copper protrusions or dendrites are deposited on the surface of copper foil, the copper protrusions or dendrites are coated with copper or a copper alloy in a cathodic electrolysis to improve the adhesion of the rough surface.

This treatment is carried out in the following bath under the 10 following conditions, for example.

| | |
|---|---|
| CuSO$_4$.5H2O | 250 g/l |
| H$_2$SO$_4$ | 100 g/l | bath temperature 50° C., current density 5 A/dm$^2$, cathodic electrolysis time about 80 seconds. Under those conditions, roughening is finished.

The thickness of the coat formed in the cathodic electrolysis is 2.5 to 40 g/m$^2$, preferably 4.5 to 20 g/m$^2$.

If the thickness of the coat is smaller than 2.5 g/m$^2$, the deposited protrusions can not be coated well. Deposited protrusions sticking to the surface of the copper foil can fall off, which is undesirable. Furthermore it is feared that copper will remain after etching. If, on the other hand, the coat is thicker than 40 g/m$^2$, the treated surface is so thick that there are such problems as decreased mechanical anchoring effect.

The copper alloy is an alloy formed of copper as main component and one or two elements selected from among Ni, Co, Zn, Sn etc. The preferred alloys include Cu—Ni, Cu—Co, Cu—Ni—Co, Cu—Zn, Cu—Sn etc.

The coated layer (plated layer) formed of copper or a copper alloy by the cathodic electrolysis further strengthens the adhesive strength between the base material and the copper foil, determining the final condition on the roughened surface.

The coating with copper or a copper alloy is followed by rust-proofing treatment.

For rust-proofing, chromate treatment and the organic rust-proofing treatment represented by benzotriazole, and silane coupling agent treatment can be named. One treatment alone or more in combination are performed.

For chromating treatment, an aqueous solution containing dichromate ions is adjusted to a suitable pH. In this solution, the copper foil is dipped or subjected to cathodic electrolysis. The chemicals used include chromium trioxide, potassium dichromate, and sodium dichromate.

For organic rust-proofing, a variety of organic rust-proofing agents are prepared into an aqueous solution. The solution is applied by dipping or spraying. Among the suitable organic rust-proofing agents are methylbenzotriazole, aminobenzotriazole, benzotriazole.

The silane coupling agent treatment is carried out by dipping or spraying an aqueous solution of silane coupling agent. Many suitable silane coupling agents can be named, including epoxy group, amino group, mercapto group, and vinyl group. A group compatible with the resin is used, and no restriction is imposed on the selection.

After going through those treatments, a finished printed circuit board can be obtained.

In this connection, the heat resistance may be increased by forming a barrier layer of Co—Mo, W or Cu—Zn disclosed in Japanese examined patent application gazettes Nos. 2-24037 and 8-19550 or another known barrier layer before the rust-proofing treatment.

In the past, as set forth above, there was no need to roughen the shiny side of the copper foil except for one used as inner DT (double treated) foil. In recent years, however, it is hoped that copper foil is given beforehand fine, uniform and light roughening treatment to improve the adhesion of resist, to drop the soft etching step and to increase the adhesive strength of the inner layers.

Copper foils given the surface treatment according to the present invention are uniform in surface condition and have a high adhesion for the resin used, and can be used as DT foils meeting those requirements.

In treating the copper foil according to the present invention, the shiny side of the copper foil is roughened lightly than the matte side.

In treatment of copper foil according to the present invention, the matte side and the shiny side may be reversed. In case the matte side and the shiny side are reversed, the shiny side of the untreated copper foil is first brought in contact with the resin when making a copper clad laminate. In such a method in which the matte side and the shiny side are reversed, the side not in contact with the resin has a better adhesion for resist after pressing with the resin than in case one side is not treated at all. In the inner layer processing step in the printed circuit board manufacturer, the preceding treatment, that is, soft etching can be dropped. Furthermore, the step of treating the surface of copper is light as compared with the conventional method of making copper foil with two treated sides. That makes manufacturing much easier at the copper manufacturer.

Embodiments

Copper foils obtained by the surface treatment method according to the present invention is used in copper-coated laminated boards, that is, printed circuit boards.

There will now be described properties of copper clad laminate embodying the present invention.

Embodiment 1

The matte side of an untreated electrodeposited copper foil 35 μm thick was subjected to cathodic electrolysis for 2.5 seconds at 50 A/dm$^2$ at a temperature of 40° C. in (A) bath prepared of:

| | |
|---|---|
| CuSO$_4$.5H$_2$O | 50 g/l |
| H$_2$SO$_4$ | 100 g/l |
| 24% solution of Ti(SO$_4$)$_2$ | 6.1 ml/l (Ti$^{4+}$:0.4 g/l) |
| Na$_2$WO$_4$.2H$_2$O | 0.0 18 g/l (W$^{6+}$:0.01 g/l) | rinsed and was subjected to cathodic electrolysis for 60 seconds at 10 A/dm$^2$ at a temperature of 40° C. in (B) bath prepared of:

| | |
|---|---|
| CuSO$_4$.5H$_2$O | 200 g/l |
| H$_2$SO$_4$ | 100 g/l | followed by rinsing.

Then, for rust-proofing, the copper foil was subjected to cathodic electrolysis for 5 seconds at 0.5 A/dm$^2$ in (C) bath prepared of:

| | |
|---|---|
| Na$_2$Cr$_2$O$_7$.2H$_2$O | 3 g/l |
| NaOH | 10 g/l | followed by rinsing and drying.

The surface properties (uniformity, surface roughness) of this copper foil were determined. The results are shown in Table 1.

Furthermore, the roughened surface of this copper foil as coated surface was pressed to a glass-polyimide resin base material under a pressure of 3.9 Mpa for 100 minutes at 200° C. Also, the copper foil was laminated with a glass-epoxy resin and pressed under a pressure of 3.9 Mpa for 60 minutes at 170° C. in the pressing step.

The properties (peel strength, copper residue) of the copper-coated laminated board were determined. The results are shown in Table 1.

Embodiment 2

The same treatment as Embodiment 1 was carried out at 40° C. except that (A) bath was replaced with (D) bath prepared of:

| | |
|---|---|
| $CuSO_4.5H_2O$ | 50 g/l |
| $H_2SO_4$ | 100 g/l |
| 24% solution of $Ti(SO_4)_2$ | 8.4 ml/l ($Ti^{4+}$:0.55 g/l) |
| $Na_2WO_4.2H_2O$ | 0.054 g/l ($W^{6+}$:0.03 g/l) | and the properties were determined the same way, and the results are shown in Table 1.

Embodiment 3

The same treatment as Embodiment 1 was carried out by cathodic electrolysis for 3 seconds at 40 A/dm² at 40° C. except that (A) bath was replaced with (E) bath prepared of:

| | |
|---|---|
| $CuSO_4.5H_2O$ | 60 g/l |
| $H_2SO_4$ | 150 g/l |
| 24% solution of $Ti(SO_4)_2$ | 9.1 ml/l ($Ti^{4+}$: 0.6 g/l) |
| $Na_2WO_4.2H_2O$ | 0.018 g/l ($W^{6+}$: 0.01 g/l) | and the properties were determined the same way, and the results are shown in Table 1.

Embodiment 4

The same treatment as Embodiment 1 was carried out by cathodic electrolysis for 4.2 seconds at 30 A/dm² at 40° C. except that (A) bath was replaced with (F) Bath prepared of:

| | |
|---|---|
| $CuSO_4.5H_2O$ | 60 g/l |
| $H_2SO_4$ | 150 g/l |
| 24% solution of $Ti(SO_4)_2$ | 12.1 ml/l ($Ti^{4+}$: 0.8 g/l) |
| $Na_2WO_4.2H_2O$ | 0.09 g/l ($W^{6+}$: 0.05 g/l) | and the properties were determined the same way, and the results are shown in Table 1.

Embodiment 5

The same treatment as Embodiment 1 was carried out by cathodic electrolysis for 4.2 seconds at 30 A/dm² at 40° C. except that (A) bath was replaced with (G) bath prepared of:

| | |
|---|---|
| $CuSO_4.5H_2O$ | 60 g/l |
| $H_2SO_4$ | 150 g/l |
| 24% solution of $Ti(SO_4)_2$ | 12.1 ml/l ($Ti^{4+}$: 0.8 g/l) |
| $Na_2WO_4.2H_2O$ | 0.144 g/l ($W^{6+}$: 0.08 g/l) | and the properties were determined the same way, and the results are shown in Table 1.

Embodiment 6

The same treatment as Embodiment 1 was carried out by cathodic electrolysis for 2.5 seconds at 60 A/dm² except that (A) bath was replaced with (H) bath prepared of:

| | |
|---|---|
| $CuSO_4.5H_2O$ | 60 g/l |
| $H_2SO_4$ | 100 g/l |
| 24% solution of $Ti(SO_4)_2$ | 4.6 ml/l ($Ti^{4+}$: 0.3 g/l) |
| $Na_2WO_4.2H_2O$ | 0.009 g/l ($W^{6+}$: 0.005 g/l) | and the properties were determined the same way, and the results are shown in Table 1.

Embodiment 7

The same treatment as Embodiment 1 was carried out at 40° C. except that (A) bath was replaced with (I) bath prepared of:

| | |
|---|---|
| $CuSO_4.5H_2O$ | 40 g/l |
| $H_2SO_4$ | 150 g/l |
| 24% solution of $Ti(SO_4)_2$ | 9.1 ml/l ($Ti^{4+}$: 0.6 g/l) |
| $Na_2WO_4.2H_2O$ | 0.054 g/l ($W^{6+}$: 0.03 g/l) | and the properties were determined the same way, and the results are shown in Table 1.

COMPARATIVE EXAMPLES

Comparative Example 1

The same treatment as Embodiment 1 was carried out at 40° C. except that (A) bath was replaced with (J) bath prepared of:

| | |
|---|---|
| $CuSO_4.5H_2O$ | 50 g/l |
| $H_2SO_4$ | 100 g/l |
| 24% solution of $Ti(SO_4)_2$ | 9.1 ml/l ($Ti^{4+}$: 0.6 g/l) | and the properties were determined the same way, and the results are shown in Table 1.

Comparative Example 2

The same treatment as Embodiment 1 was carried out at 40° C. except that (A) bath was replaced with (K) bath prepared of:

| | |
|---|---|
| $CuSO_4.5H_2O$ | 50 g/l |
| $H_2SO_4$ | 100 g/l |
| $Na_2WO_4.2H_2O$ | 0.018 g/l ($W^{6+}$: 0.01 g/l) | and the properties were determined the same way, and the results are shown in Table 1.

Comparative Example 3

The same treatment as Embodiment 1 was carried out at 40° C. except that (A) bath was replaced with (L) bath prepared of:

| | |
|---|---|
| $CuSO_4 \cdot 5H_2O$ | 50 g/l |
| $H_2SO_4$ | 100 g/l | and the properties were determined the same way, and the results are shown in Table 1.

TABLE 1

| | Uniformity | Roughness Rz ($\mu$m) on roughened side | Peel strength (N/mm) to glass-polyimide resin base | Peel strength (FR-4) (N/mm) to glass-epoxy resin base | Copper found left on etched base side |
|---|---|---|---|---|---|
| Embodiments | | | | | |
| (1) | O | 8.9 | 2.05 | 2.00 | O |
| (2) | O | 8.7 | 2.01 | 1.95 | O |
| (3) | O | 7.6 | 2.11 | 1.82 | O |
| (4) | O | 9.0 | 1.84 | 2.03 | O |
| (5) | O | 8.5 | 1.86 | 1.86 | O |
| (6) | O | 8.3 | 1.85 | 1.82 | O |
| (7) | O | 8.4 | 1.98 | 1.97 | O |
| Comparative example | | | | | |
| (1) | Δ | 8.8 | 1.57 | 1.87 | X |
| (2) | O | 8.4 | 1.58 | 1.91 | O |
| (3) | X | 11.1 | 1.90 | 2.15 | X |

"Uniformity" was evaluated by examining the surface condition under an electron microscope at a magnification of about 1,000. The evaluation results are indicated by the following symbols:

O: roughened particles on the matte side are not large and uniform with little differences in size found among them.

A: roughened particles on the matte side are not large but some differences in size are found among them.

X: roughened particles on the matte side are very large and not uniform.

"Peel strength" means a degree of strength required to tear the copper foil from the base material. The strength was determined in accordance with JIS-C-6481 (1986) 5.7. "Copper found left on etched base side" was checked under a stereomicroscope at a magnification of 50 after copper was removed by cupric chloride etching. Table 1 shows the evaluation results on the glass-polyimide resin base material. The evaluation results are indicated by the following symbols:

O: no copper found left

X: copper found left

The results in Table 1 show that the roughened surface condition treated according to the present invention is high in uniformity and low in roughness as compared with those by the prior art. According to the present invention, while the peel strength to the glass-epoxy resin base material (Grade FR-4) is somewhat low, a high degree of adhesion is exhibited with glass-polyimide. Thus, excellent surface treated copper foil can be obtained.

As set forth above, the surface treatment process according to the present invention has the following advantages (1) roughens the surface without using such harmful element as arsenic, selenium and tellurium, presenting no environmental problems and having no fear of harmful effects on humans.

(2) Produces a surface treated copper foil with a uniform roughness condition on the matte side and with a high adhesive strength to the resins, especially glass-polyimide resin base material which is weak in adhesive strength, thus adapted to high density printed circuit boards.

(3) Needs only light treatment and easy to include in the copper production process, thus permitting mass production.

What is claimed is:

1. A process of treating the surface of copper foil which comprises the steps of:

roughening the surface to deposit copper protrusions by subjecting at least one side of said copper foil near or above the limiting current density in an electrolytic bath containing titanium ions and tungsten ions and prepared by adding sulfuric acid and copper sulfate, coating said depositions with copper or a copper alloy by a cathodic electrolysis, and giving to the surface of said copper or the copper alloy at least one of the rust-proofing treatments selected from the group consisting of chromate treatment, organic rust-proofing treatment and silane coupling agent treatment.

2. The process of treating the surface of copper foil according to claim 1, wherein the electrolytic bath contains 0.03 to 5 g/l of titanium ions and 0.001 to 0.3 g/l of tungsten ions.

* * * * *